(12) United States Patent
Muehlbauer et al.

(10) Patent No.: US 10,626,012 B2
(45) Date of Patent: Apr. 21, 2020

(54) SEMICONDUCTOR DEVICE INCLUDING A CAVITY LID

(71) Applicant: Infineon Technologies AG, Neubiberg (DE)

(72) Inventors: Franz-Xaver Muehlbauer, Rimbach (DE); Dominic Maier, Pleystein (DE); Thomas Kilger, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 418 days.

(21) Appl. No.: 14/684,815

(22) Filed: Apr. 13, 2015

(65) Prior Publication Data

US 2016/0297672 A1 Oct. 13, 2016

(51) Int. Cl.
*B81C 1/00* (2006.01)
*B81B 7/00* (2006.01)

(52) U.S. Cl.
CPC ........ *B81C 1/00333* (2013.01); *B81B 7/0064* (2013.01); *B81B 2201/0257* (2013.01); *B81C 2203/0109* (2013.01); *B81C 2203/0154* (2013.01); *B81C 2203/0163* (2013.01)

(58) Field of Classification Search
CPC ....... H01L 2924/00; H01L 2924/00014; H01L 2924/1461; H01L 21/56; H01L 23/552; H01L 21/67772; H01L 31/0203; H01L 31/048; H01L 2023/4031; H01L 2225/06582; H01L 29/785; H01L 29/78606; H01L 29/78609; H01L 29/78663; H01L 29/78666; H01L 29/78669; H01L 29/78672; H01L 29/861; H01L 29/8611; H01L 29/8611; H01L 29/866; H01L 29/872; H01L 29/94; B81C 1/00333; B81C 2203/0109; B81C 2203/0154; B81C 2203/0163; B81B 7/0064; B81B 2201/0257
USPC .......................... 257/416, 414, 670, 676, 690
See application file for complete search history.

(56) References Cited

U.S. PATENT DOCUMENTS

| | | | |
|---|---|---|---|
| 5,889,872 A * | 3/1999 | Sooriakumar | H04R 19/016 381/174 |
| 7,847,387 B2 | 12/2010 | Kilger et al. | |
| 9,069,005 B2 * | 6/2015 | Ruby | G01P 15/125 |
| 2009/0057928 A1 * | 3/2009 | Zhai | H01L 21/563 257/789 |
| 2009/0127638 A1 * | 5/2009 | Kilger | B81B 7/007 257/415 |
| 2010/0078669 A1 * | 4/2010 | Cho | H01L 33/46 257/98 |
| 2010/0127385 A1 * | 5/2010 | Weekamp | H01L 21/4846 257/693 |
| 2010/0148333 A1 * | 6/2010 | Tang | H01L 23/055 257/684 |

(Continued)

*Primary Examiner* — Moin M Rahman
(74) *Attorney, Agent, or Firm* — Dicke, Billig & Czaja, PLLC

(57) ABSTRACT

A semiconductor device having a lid, and method of making a semiconductor device having a lid is disclosed. The semiconductor device includes a substrate. A device is positioned at the substrate. A lid made of a semiconductor material is positioned over the device to form a protective cavity about the device. The lid is formed using a semiconductor process. In other examples, the lid may be made of a nonconductive material, such as a polymer material. The lids may be formed as part of a batch process.

27 Claims, 9 Drawing Sheets

(56) References Cited

U.S. PATENT DOCUMENTS

| | | | |
|---|---|---|---|
| 2010/0244161 A1* | 9/2010 | Tabrizi | H01L 23/055 257/415 |
| 2011/0006953 A1* | 1/2011 | Chiang | G06F 1/1616 343/702 |
| 2012/0299170 A1* | 11/2012 | Kehrer | H01L 23/3107 257/673 |
| 2013/0032905 A1* | 2/2013 | Lo | B81B 7/007 257/416 |
| 2014/0036464 A1 | 2/2014 | Kilger | |
| 2014/0091450 A1* | 4/2014 | Pueschner | H01L 23/5388 257/679 |
| 2016/0240457 A1* | 8/2016 | Lee | H01L 23/481 |

* cited by examiner

SEMICONDUCTOR DEVICE INCLUDING A CAVITY LID

BACKGROUND

Semiconductor devices, such as sensors, often include an electrical component positioned within a cavity. Cavities may be required to have a relatively high volume (e.g., for microphones) or only need a relatively thin cavity (e.g., a SAW filter) above a resonating member. A lid or housing is positioned over the electrical component to create the cavity that protects the electrical component (e.g., a vibrating component) from additional processes such as encapsulation of mold materials. Further, the lid may provide a level of shielding against electromagnetic interference (EMI).

Typical lids are formed out of metal. They may be produced using a stamping process. Stamped lids can only be shrunk (i.e., made smaller) to a certain extent and require being handled as bulk material. Assembly efforts require separate steps to pick and place the stamped metal lids over the component to form the semiconductor device cavities. Semiconductor devices continue to require smaller packaging and cost saving processes, making it difficult to use conventional metal lid processes.

For these and other reasons, there is a need for the present invention.

SUMMARY

One embodiment provides a semiconductor device having a lid, and method of making a semiconductor device having a lid. The semiconductor device includes a substrate. A device is positioned at the substrate. A lid made of a semiconductor material is positioned over the device to form a protective cavity about the device.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
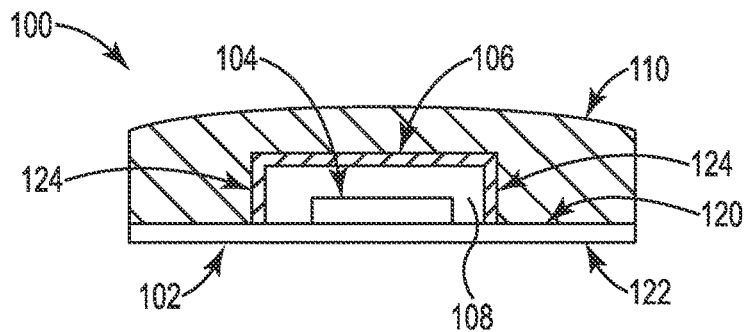
FIG. 1 illustrates one embodiment of a semiconductor device having a lid.

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As used herein, the term "electrically coupled" is not meant to mean that the elements must be directly coupled together and intervening elements may be provided between the "electrically coupled" elements.

The semiconductor device(s) described in the following description contain a device such as a sensor or other electrical components. The specific embodiment of the device is not important in this case. For example, the device may be a sensor chip that contains electro-mechanical or electro-optical functional elements. An example of an electro-mechanical sensor is a microphone. Examples for the electro-optical case are photo-diodes or diode lasers. The sensor chips may also function fully electrically, for example as Hall effect sensors. The sensor chips may be embodied as MEMS (Micro-Electro Mechanical Systems), wherein micro-mechanical moveable structures such as, for example, bridges, membranes or reed structures may be provided. Such sensor chips may be motion sensors, which may be embodied as acceleration sensors (detecting accelerations in different spatial directions) or rotation sensors. Sensors of this type are also referred to as gyrosensors, roll-over sensors, impact sensors, inertial sensors, etc. They are used for example in the automotive industry for signal detection in ESP (Electronic Stability Program) systems, ABS (Anti-Lock Breaking Systems), airbags and the like. Usually such sensor chips are made of a semiconductor material. However, the sensor chips are not limited to be fabricated from a specific semiconductor material. They may additionally contain non-conductive inorganic and/or organic materials.

There are also illustrated devices which may further include a semiconductor chip, which may serve to control the functionality of the sensor chip or to process signals that are sensed and/or generated by the sensor chip. By way of example, in the case of the sensor chip being a motion sensor, the deflection of a moveable element comprised in the sensor chip may be read piezoresistively or capacitively and may then be processed by the semiconductor chip. The semiconductor chip may be coupled to the sensor chip for the purpose of a (bidirectional) data exchange. The semiconductor chip may, for example, be embodied as an ASIC (Application Specific Integrated Circuit).

The substrate supporting the sensor chip may have a thermal expansion coefficient similar or close to the thermal expansion coefficient of the sensor chip, in one embodiment when the substrate is in close contact with the sensor chip. The substrate may thus be fabricated from a material having a thermal expansion coefficient in the range from $0.3 \cdot 10^{-6}$/K to $8.2 \cdot 10^{-6}$/K and in the range $4.0 \cdot 10^{-6}$/K to $4.5 \cdot 10^{-6}$/K.

FIG. 1 illustrates one embodiment of a semiconductor device generally at 100. The semiconductor device 100 includes a substrate 102. A device 104 is positioned at the substrate 102. A lid or housing 106 is positioned over the device 104 to form a protective cavity 108 about the device 104. In one example, the lid 106 is made of a semiconductor material using a semiconductor process. In another example, the lid 106 is made of a polymer material. A material layer 110 may be positioned over the substrate 102 and lid 106. In one example, the material layer 110 is made of a mold compound.

In one example, substrate 102 is made of a printed circuit board (PCB) material. The substrate 102 includes a first surface 120 and a second surface 122. Device 104 is positioned on first surface 120. Lid 106 is positioned or arranged on substrate 102 such that walls 124 form the boundaries of cavity 108. One or more other devices (not shown) may also be positioned on the substrate 102. Lid 106 protects the device 104 from coming in contact with other parts of the semiconductor device (such as material layer 110) by providing the cavity 108 about the device 104. In one example, the device 104 is a sensor chip, such as a microphone. In another example, device 104 includes a SAW filter. Cavity 108 may be a relatively large, high volume cavity or only a very thin cavity.

Figure 2:
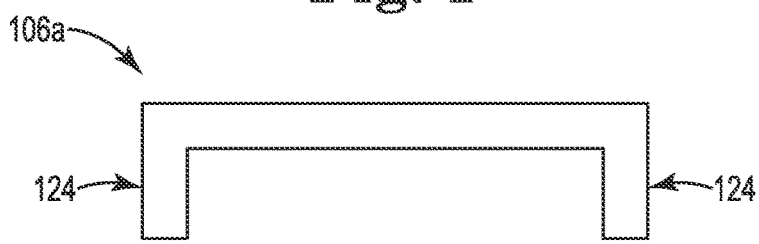
FIG. 2 illustrates one embodiment of a lid.

FIG. 2 illustrates one example of a lid that can be used in a semiconductor device, indicated as lid 106a. Lid 106a is made of a semiconductor material, using a semiconductor process. In one example, lid 106a is made of silicon. Lid 106a can be made of other semiconductor materials. Lid 106a includes cavity walls 124, and is configured and shaped to provide a cavity 108 when placed over a device on a substrate. In another example, lid 106a is made of other materials, such as a mold material or polymer material.

Figure 3:
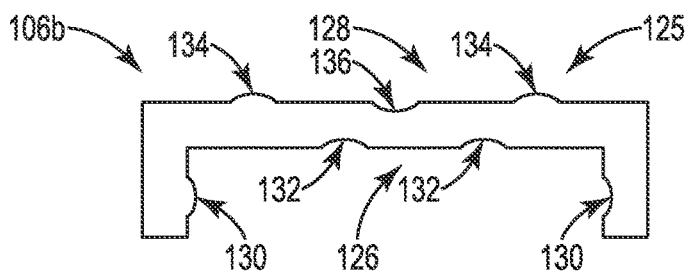
FIG. 3 illustrates another embodiment of a lid including a patterned surface.

FIG. 3 illustrates another example of a lid that can be used in a semiconductor device, indicated as lid 106b. Lid 106b is similar to other lids described herein. Lid 106b is made of a semiconductor material, using a semiconductor process. Lid 106b includes very fine details formed during the semiconductor manufacturing process. In one example, lid 106b includes one or more patterned surfaces 125. Lid 106b includes a first, interior surface 126 and a second, exterior surface 128. First surface 126 and second surface 128 are patterned. First surface 126 includes one or more bumps 130 and indents 132. Similarly, second surface 128 includes one or more bumps 134 and indents 136. In another example, lid 106b is made of other materials, such as a mold material or polymer material.

Figure 4:
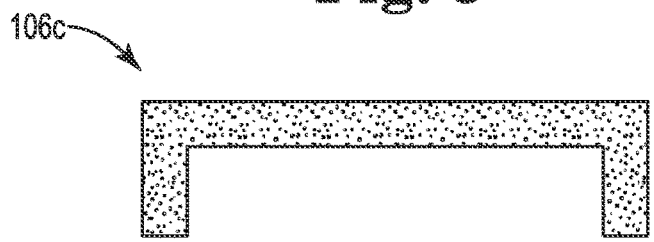
FIG. 4 illustrates another embodiment of a lid made of a material having shielding properties.

FIG. 4 illustrates another example of a lid that can be used in a semiconductor device, indicated as lid 106c. Lid 106c is similar to the other lids described herein. Lid 106c further provides shielding, for example EMI shielding, which may be required for certain devices. In one example, shielding is provided by making lid 106c from a conductive material, such as a highly doped semiconductor material. In one example, the material is a highly doped silicon material, having a very low specific resistance. In one example, the specific resistance is less than one Ohm meter, and may be as low as 2 milli-Ohm meter. In another example, lid 106c is made of other materials, such as a mold material or polymer material, and may be loaded with a conductive material for shielding.

Figure 5:
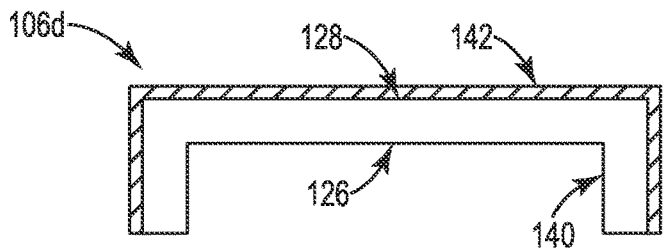
FIG. 5 illustrates another embodiment of a lid having shielding properties.

FIG. 5 illustrates another example of a lid that can be used in a semiconductor device, indicated as lid 106d. Lid 106d is similar to the other lids described herein. Lid 106d further includes EMI shielding properties. In one example, lid 106d includes a first layer 140 and a second layer 142. First layer 140 is similar to lid 106a previously described herein, and is made of a semiconductor material such as silicon. Second layer 142 is a shielding layer and in one example is formed of a conductive material such as a highly conductive metal. In one example, the metal is copper. In other examples, shielding layer 142 is made of other metals. First layer 140 includes a first, interior surface 126 and a second, exterior surface 128. The second layer 142 is at least partially formed on the second surface 128. In one example, the second layer 142 is deposited on the second surface 128 using a metal deposition process. In another example, lid 106d is made of other materials, such as a mold material or polymer material.

Figure 6:
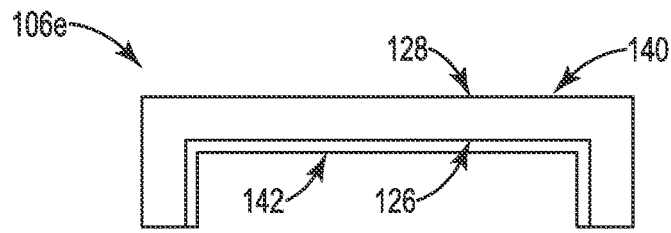
FIG. 6 illustrates another embodiment of a lid having shielding properties.

FIG. 6 illustrates one example of a lid that can be used in a semiconductor device, indicated as lid 106e. Lid 106e is similar to lid 106d except that the second layer 142 is at least partially formed on the first, interior layer 126. First layer 140 can be made of a semiconductor material, such as silicon, or other material such as a mold material or polymer material.

Figure 7:
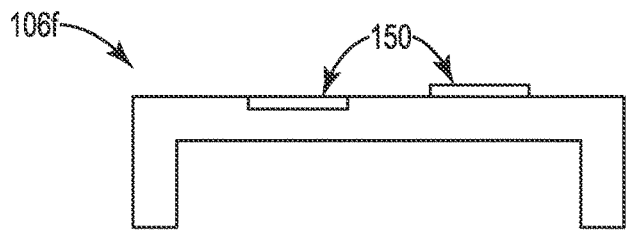
FIG. 7 illustrates another embodiment of a lid, including one or more active devices or components.

FIG. 7 illustrates one example of a lid that can be used in a semiconductor device, indicated as lid 106f. Lid 106e can be similar to the lids 106a-106e previously described herein, and further may include one or more active devices 150. Active devices 150 may be an individual component, semiconductor chip, or an integrated circuit. Active devices 150 may be formed integral lid 106f, or at least partially positioned on one of the surfaces (interior or exterior) of the lid.

Figure 8A:
FIGS. 8A-8D illustrate one embodiment of a method for fabricating a semiconductor device including a lid.
Figure 8B:
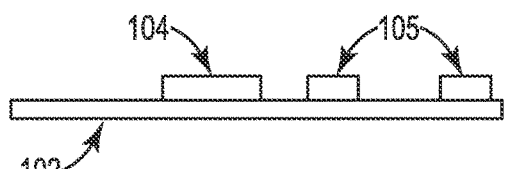

FIGS. 8A-8B illustrate one embodiment of a method of manufacturing a semiconductor device having a lid, similar to the semiconductor device 100 illustrated in FIG. 1. As illustrated in FIG. 8A, semiconductor substrate 102 is provided. In one example, the substrate 102 is made of a printed circuit board material. As illustrated in FIG. 8B, a device 104 is positioned at the substrate 102. In one or more examples, the device is a sensor, sensor component, or sensor chip. For example, the sensor may include a microphone. Further active or passive devices 105 may also be positioned at the substrate 102.

Figure 8C:
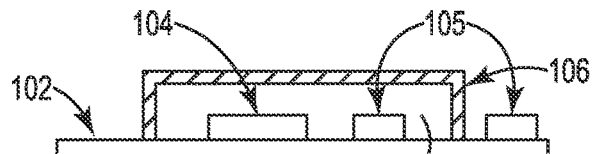
Figure 8D:
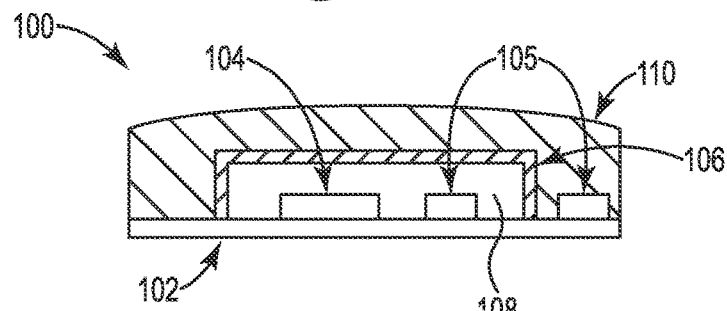

In FIG. 8C, lid or housing 106 is positioned over the device 104. Lid 106 may also be positioned over one or more of the devices 105. The lid 106 is positioned over device 104 such that it forms cavity 108 around the semiconductor device 104. Lid 106 includes lid sidewalls that contact the substrate 102, sealing off the interior cavity of the lid. Lid 106 protects device 104, and may also provide EMI shielding for device 104. In one example, lid 106 is formed using a semiconductor process and may be made of a semiconductor material. In other examples, lid 106 is made of other materials, such as a polymer material. In one example, the lid 106 is similar to at least one of lids 106a-106f previously detailed herein. One or more methods of manufacturing lid 106 is described in detail in this specification. After lid 106 is positioned over device 104, additional material layers may be added, such as material layer 110. In one example, material layer 110 is formed of an encapsulation material such as a mold compound. Material layer 110 is formed over the lid 106 and part of the substrate 102 located outside of the lid 106 interior cavity.

The following figures illustrate multiple embodiments of making a lid using a semiconductor manufacturing process. By using these processes, the lids can be much smaller in size than lids made using conventional processes (e.g., metal stamping), and may also be formed with very fine details and structures. Further, the lids themselves may have shielding properties and may include one or more additional active or passive devices or components.

Figure 9A:
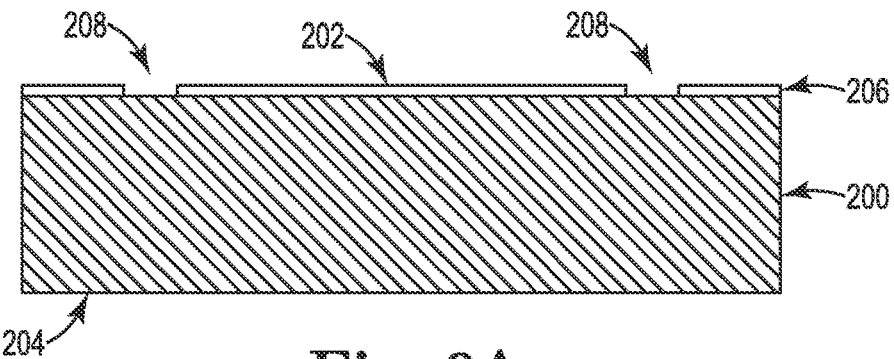
FIGS. 9A-9F illustrate one embodiment of a method for fabricating a semiconductor device including a lid.

FIGS. 9A-9D illustrate one embodiment of making a lid 106 using a semiconductor manufacturing process, including etching of a semiconductor from two sides to form a lid geometric structure. As illustrated in FIG. 9A, a semiconductor substrate 200, such as in the form of a semiconductor wafer, is provided. The semiconductor substrate 200 includes a first side 202 and a second side 204. In one example, the first side 202 is the semiconductor substrate backside and the second side 204 is the semiconductor front side. A mask layer 206 is positioned on the first side 202. The mask layer 206 includes a desired pattern for performing an etching process on semiconductor substrate 200. In one example, mask layer 206 includes etching openings 208. In one example, mask layer 206 is made of silicon oxide. It is recognized that mask layer 206 can be a coating made of other etch stop materials.

Figure 9B:
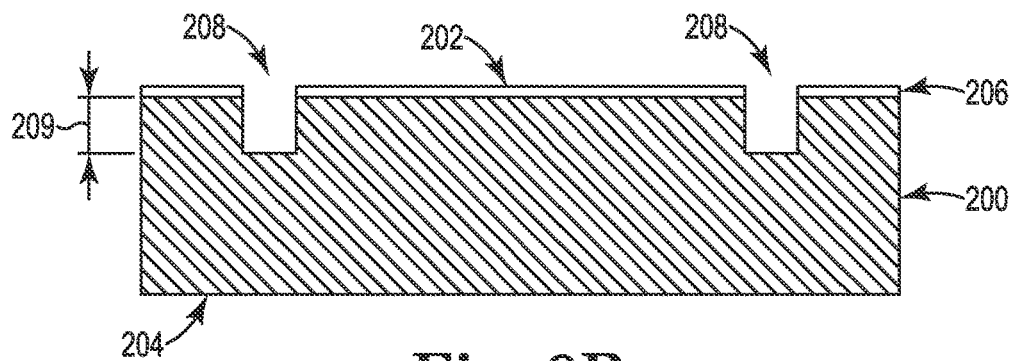

As illustrate in FIG. 9B, the semiconductor substrate is etched from the first side 202 to an etch depth 209. In one example, the etch depth 209 is approximately equal to a desired width of the lid.

Figure 9C:
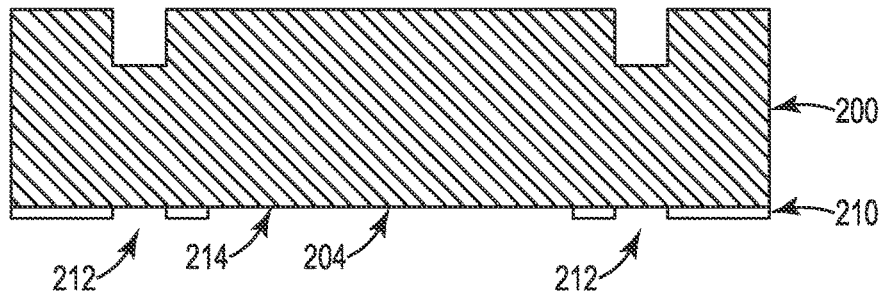

As illustrated in FIG. 9C, a mask layer 210 is positioned on the second side 204 of the semiconductor substrate 200. The mask layer 210 includes a desired pattern for performing an etching process on semiconductor substrate 200. In one example, mask layer 210 includes etching openings 212 that align with the previous etching openings 208 in mask layer 206. Further, mask layer 210 includes an opening 214 for forming the interior walls of the lid. In one example, mask layer 210 is made of silicon oxide. It is recognized that mask layer 210 can be a coating made of other etch stop materials.

Figure 9D:
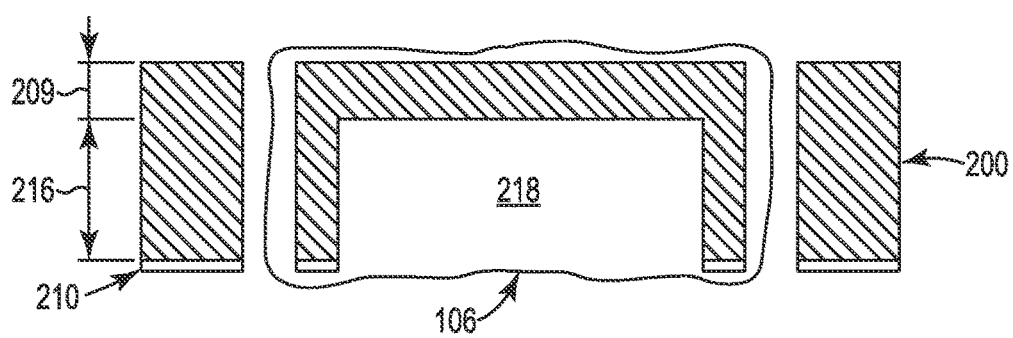

As illustrated in FIG. 9D, the semiconductor substrate 200 is etched from the second side 204. The etching process is performed until the first opening and second opening are etched through to meet the previously etched vias, and the opening 214 is etched to form lid volume 218 defined by the interior walls of the lid cavity, indicated by etch depth 216. Once the etching process is done, the structure of lid 106 is complete.

In one example, the etched lid is made of silicon. Additionally, the lid may include shielding properties. In one example, the lid is made of a highly doped silicon to provide shielding properties to the lid. Alternatively, an additional process may be provided to coat the lid with a thin metal layer. In one example, the lid is coated with a metal layer using a deposition process (e.g., sputtering or plating).

Figure 9E:
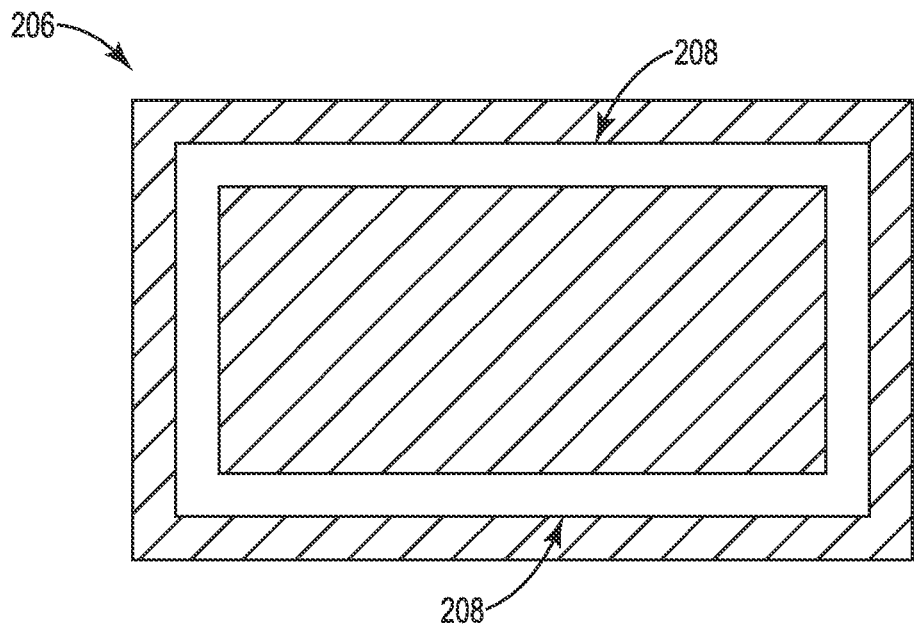
Figure 9F:
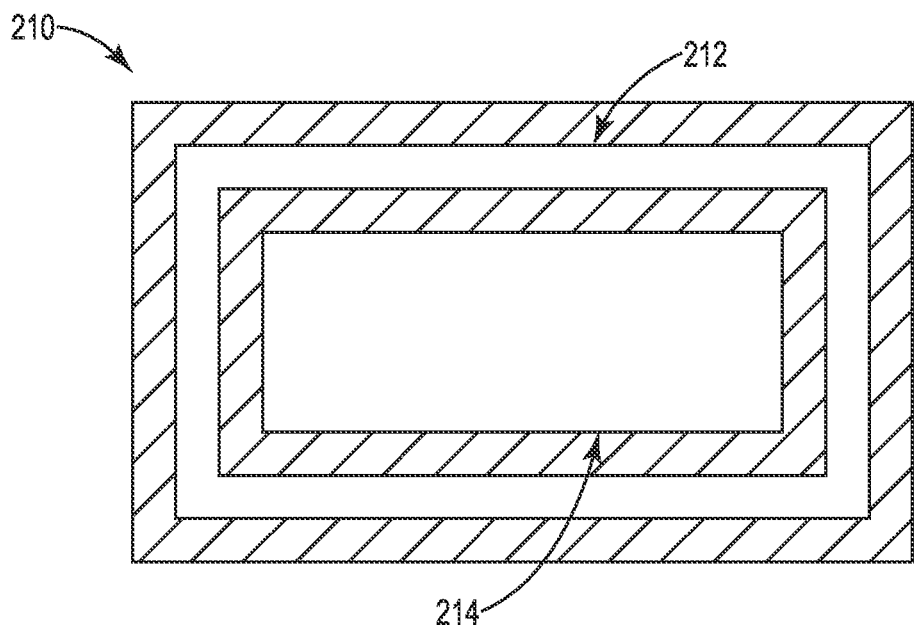

FIG. 9E illustrates one example of a plan view of mask layer 206. Mask layer 206 includes first etching opening 208 but does not include an opening a central region of the mask. FIG. 9F illustrates one example of a plan view of mask layer 210. Mask layer 210 includes second etching opening 212 that corresponds with and aligns with mask layer 206 first etching opening 208. Mask layer 210 further includes second etching opening 214 that is also used to form/define the lid sidewalls and central cavity.

Figure 10A:
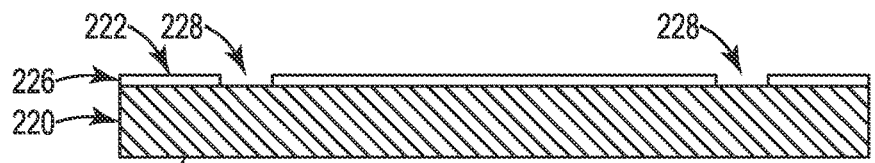
FIGS. 10A-10D illustrate one embodiment of a method for fabricating a semiconductor device including a lid.

FIGS. 10A-10D illustrate one embodiment of making a lid using a semiconductor manufacturing process, including etching of a semiconductor substrate from only one side to form a desired lid geometric structure. As illustrated in FIG. 10A, a first substrate 220, such as in the form of a semiconductor wafer, is provided. The first substrate 220 includes a first substrate side 222 and a first substrate side 224. A first substrate mask layer 226 is positioned on the first substrate side 222. The mask layer 226 includes a desired pattern for performing an etching process on semiconductor substrate 220. In one example, mask layer 226 includes etching openings 228. In one example, mask layer 226 is made of silicon oxide. It is recognized that mask layer 226 can be a coating made of other etch stop materials.

Figure 10B:
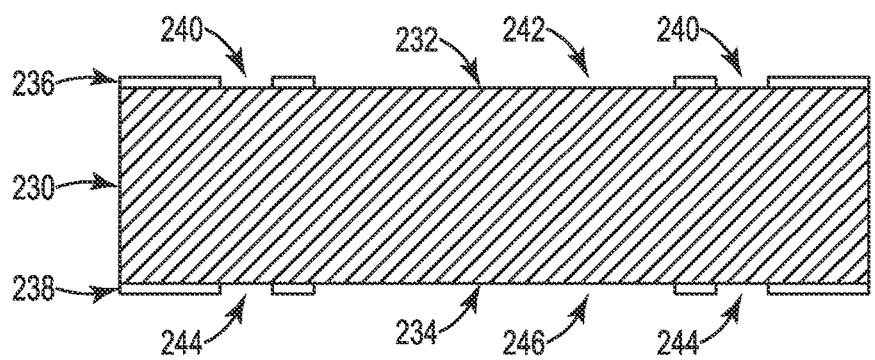

As illustrated in FIG. 10B, a second substrate 230, such as in the form of a silicon wafer, is provided. The second substrate 230 includes a second substrate side 232 and a second substrate side 234. A second substrate mask layer 236 is positioned on the second substrate side 232, and a second substrate mask layer 238 is positioned on the second substrate side 234. Second substrate mask layers 236, 238 include a desired pattern for performing an etching process on second substrate 230. In one example, second substrate mask layer 236 include wall etching openings 240 and cavity etching opening 242. Similarly, second substrate mask layer 238 includes wall etching openings 244 and cavity etching opening 246. When positioned on the corresponding second substrate sides 232 and 234, the wall etching openings 240 are aligned with the wall etching openings 244 and the cavity etching opening 242 is aligned with the cavity etching opening 246. In one example, mask layers 236 and 238 are made of silicon oxide. It is recognized that mask layers 236 and 238 can be a coating made of other etch stop materials.

Figure 10C:
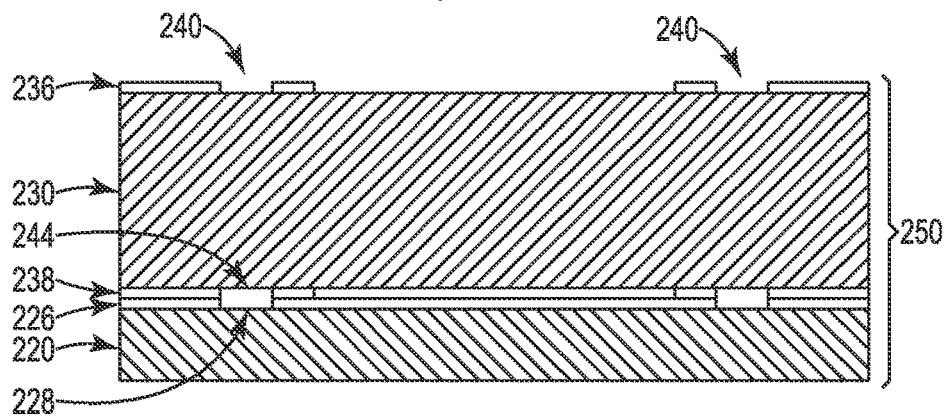

As illustrated in FIG. 10C, second substrate 230 (with mask 236 and mask 238) is bonded on to first substrate 220 (with mask 226) to form substrate assembly 250. First substrate side 222 is bonded to second substrate side 234, including mask 226 and mask 238. As such, first substrate mask 226 etching openings 228 aligned with second substrate mask 238 etching openings 244.

Figure 10D:
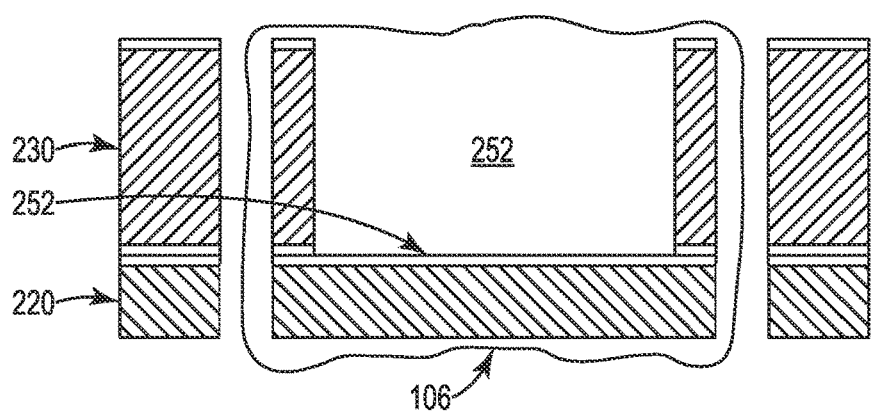

As illustrated in FIG. 10D an etching process is performed on substrate assembly 250 from the topside, which is the second substrate side 232. The etching process is performed until the substrate assembly is etched all the way through at openings 240, 244, and 228 to form the outside walls of the lid 106. Further, since mask layer 226 does not have an opening that aligns with mask cavity openings 242 and 246 (indicated at 252), the mask layer 226 acts as an etch stop layer to define the interior volume of the lid 106 cavity 252.

In one example, the etched lid is made of silicon. Additionally, the lid may include shielding properties. On one example, the lid is made of a highly doped silicon to provide shielding properties to the lid. Alternatively, an additional process may be provided to coat the lid with a thin metal layer. In one example, the lid is coated with a metal layer using a deposition process (e.g., sputtering or plating).

FIGS. 11A-11F illustrate one embodiment of making a lid made of a polymer material using a semiconductor manufacturing process, to form a lid having a desired geometric structure. In this embodiment, a negative of the lid geometric structure is first formed out of a semiconductor material. The negative is then used to form the lid having the desired structure, from a polymer material. In one example, the negative is also plated with a metal layer such that the metal layer is transferred to the resulting polymer lid.

Figure 11A:
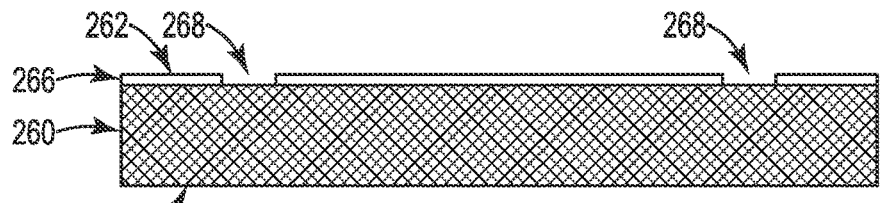
FIGS. 11A-11F illustrate one embodiment of a method for fabricating a semiconductor device including a lid.

As illustrated in FIG. 11A, a semiconductor substrate 260, such as in the form of a semiconductor wafer, is provided. The semiconductor substrate 260 includes a first side 262 and a second side 264. In one example, the first side 262 is the semiconductor substrate backside and the second side 264 is the semiconductor frontside. A mask layer 266 is positioned on the first side 262. The mask layer 266 includes a desired pattern for performing an etching process on semiconductor substrate 260. In one example, mask layer 266 includes etching openings 268. In one example, mask layer 266 is made of silicon oxide. It is recognized that mask layer 266 can be a coating made of other etch stop materials.

Figure 11B:
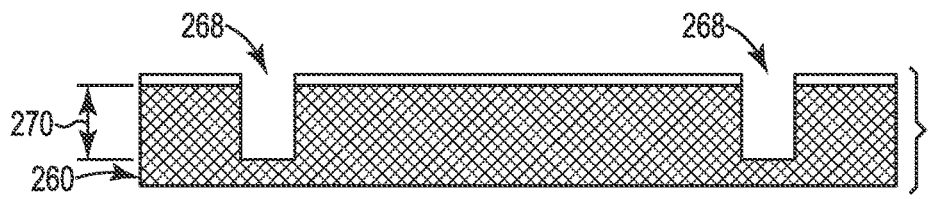
Figure 11C:
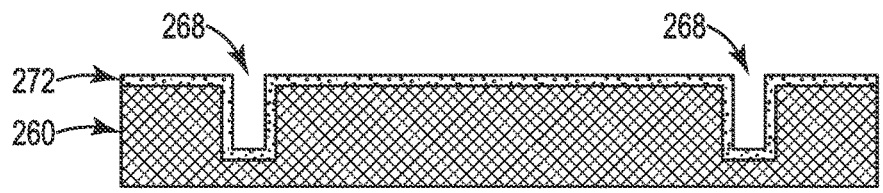

As illustrate in FIG. 11B, the semiconductor substrate is etched from the first side 262 until a desired etch stop depth 270 is reached. In one example, the etch stop depth 270 is approximately equal to a desired length of a lid cavity interior wall. As illustrated in FIG. 11C, a metal layer 272 is positioned on first side 262, including in etched openings 268. In one example, metal layer 272 is deposited on first side 262 using a metal deposition process.

Figure 11D:
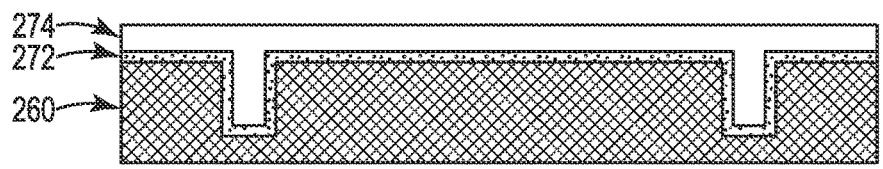
Figure 11E:
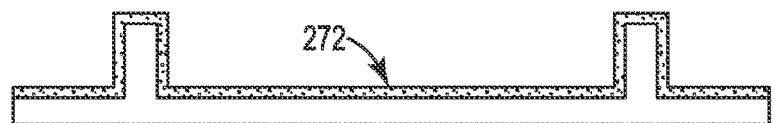
Figure 11F:
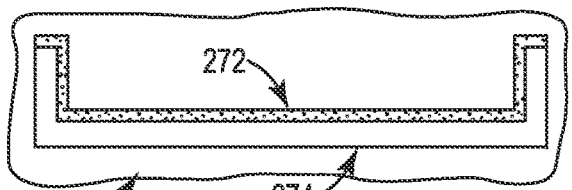

As illustrated in FIG. 11C, a mold compound 274 is overmolded onto the metal layer 272. In one example, the mold compound is a polymer material. As illustrated in FIG. 11D, a silicon etching process is performed on the substrate second side 264 until all of the substrate is removed. As illustrated in FIG. 11F, the resulting structure is singulated to provide a lid 106 with a desired structure or form. The lid 106 is made of a polymer material layer 274 and further includes a shielding layer in metal layer 272.

In another example, the polymer material layer 274 can be a highly conductive material layer having a low resistance. For example, the highly conductive material layer can be loaded with a conductive material such as metal particles.

FIGS. 12A-12F illustrate one embodiment of making a lid made of a polymer material using a semiconductor manufacturing process, to form a lid having a desired geometric structure. In this embodiment, a negative of the lid geometric structure is first formed out of metal. The negative is then used to form the lid having the desired structure, from a polymer material.

Figure 12A:
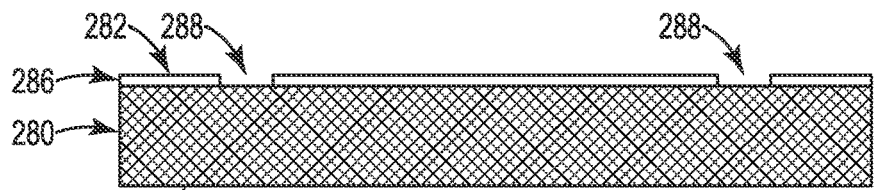
FIGS. 12A-12F illustrate one embodiment of a method for fabricating a semiconductor device including a lid.

As illustrated in FIG. 12A, a metal substrate 280, for example a copper plate, is provided. The substrate 280 includes a first side 282 and a second side 284. In one example, the first side 282 is the metal substrate backside and the second side 284 is the metal substrate frontside. A mask layer 286 is positioned on the first side 282. The mask layer 286 includes a desired pattern for performing an etching process on metal substrate 280. In one example, mask layer 286 includes etching openings 288. In one example, mask layer 286 is made of a mask material suitable for use with a printed circuit board. It is recognized that mask layer 286 can be a coating made of other etch stop materials.

Figure 12B:
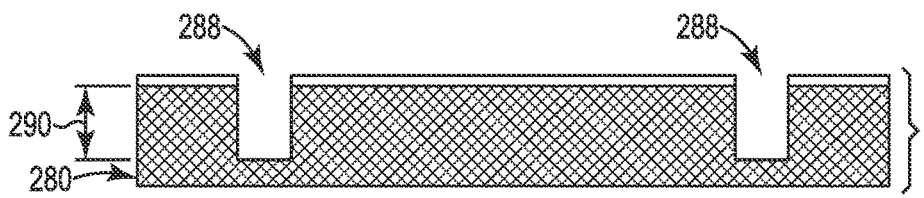
Figure 12C:
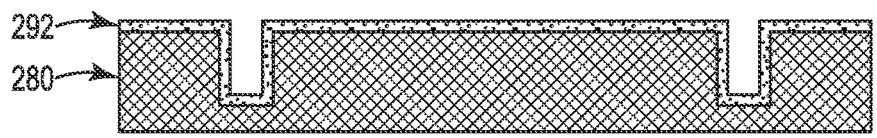

As illustrate in FIG. 12B, the metal substrate is etched from the first side 282 until a desired etch stop depth 290 is reached. In one example, the etch stop depth 290 is approximately equal to a desired length of a lid cavity interior wall. As illustrated in FIG. 12C, a metal layer 292 is positioned on first side 282, including in etched openings 288. In one example, metal layer 292 is deposited on first side 282 using a metal deposition process. In one example, metal layer 292 is made of Nickel.

Figure 12D:
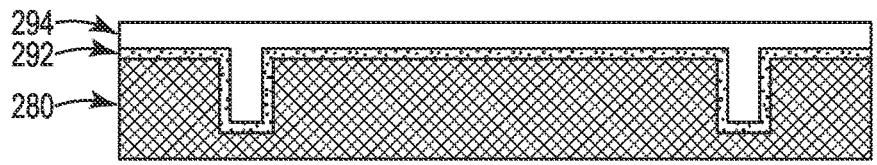
Figure 12E:
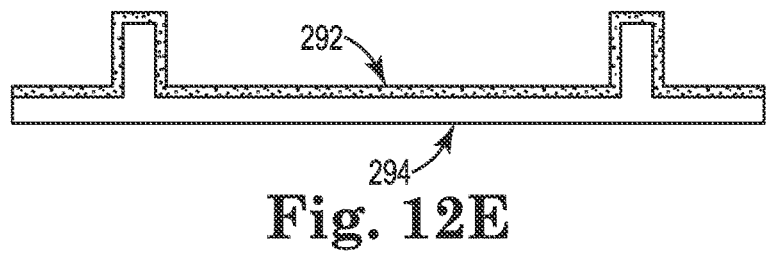
Figure 12F:
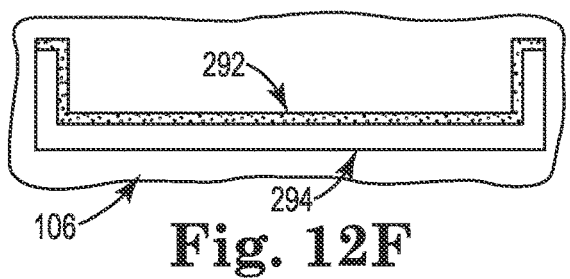

As illustrated in FIG. 12D, a mold compound 294 is overmolded onto the metal layer 292. In one example, the mold compound is a polymer material. As illustrated in FIG. 12E, a metal etching process (e.g., copper etching process) is performed on the substrate second side 284 until all of the substrate is removed. As illustrated in FIG. 12F, the resulting structure is singulated to provide a lid 106 with a desired structure or form. The lid 106 is made of a polymer material layer 294 and further includes a shielding layer in metal layer 292.

It is recognized that alternative processes may also be used. For example, metal layer 292 can be deposited (e.g., by sputtering or plating) in a special desired slope shape. Further, as an alternative to the metal deposition of FIG. 11C, through mold vias could be created in the semiconductor substrate (e.g., by lasers). Shielding could then be provided by using a backside plating process. The vias can be created in the mold by laser and then plated with metal, or the metal substrate can be etched to different levels. After etching for example the copper, the Nickel remains separated to the cavity and can be connected, for example, by grinding without harming the cavity. In another example, mold compound 294 can be a highly conductive mold compound having a low resistance. In one example, the highly conductive mold compound is loaded with conductive particles such as metal particles.

FIGS. 13A-13D illustrate one embodiment of mass production/batch processing of semiconductor devices, in particular a process is disclosed illustrating batch lid attachment to semiconductor devices. In this example, the lids are made of a semiconductor material, and are singulated after they are attached to a semiconductor device.

Figure 13A:
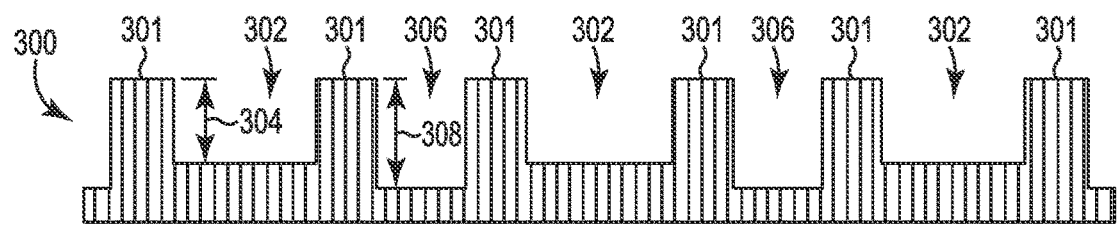
FIGS. 13A-13D illustrate one embodiment of a method for fabricating a semiconductor device including a lid.

As illustrated in FIG. 13A, a structured silicon substrate 300 or wafer is formed. The structured substrate 300 includes pillars 301 defining first (lid) cavities 302 having a first depth 304, and second cavities 306 having a second depth 308 located between the pillars 301. In one example, the first depth 304 is different than the second depth 308. In one example, the second depth 308 is greater than the first depth 304. Structured substrate 300 can be formed using etching processes similar to those previously described in this specification. For example, the structured substrate 300 could be formed by bonding a number of masked silicon substrates together resulting in mask etch stops at different depths. The silicon wafer could then be one-sided etched, for example from the topside, to obtain first cavities 304 and second cavities 308 having different depths, width and volumes.

Figure 13B:
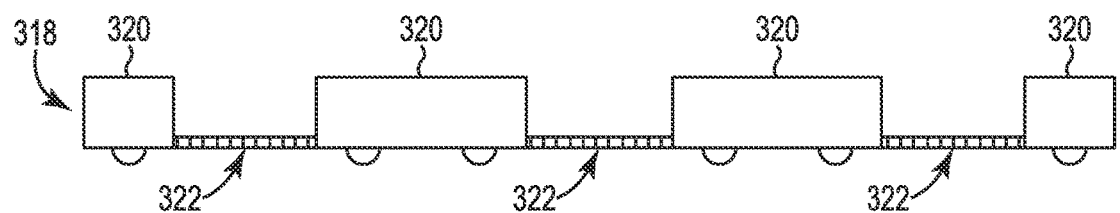
Figure 13C:
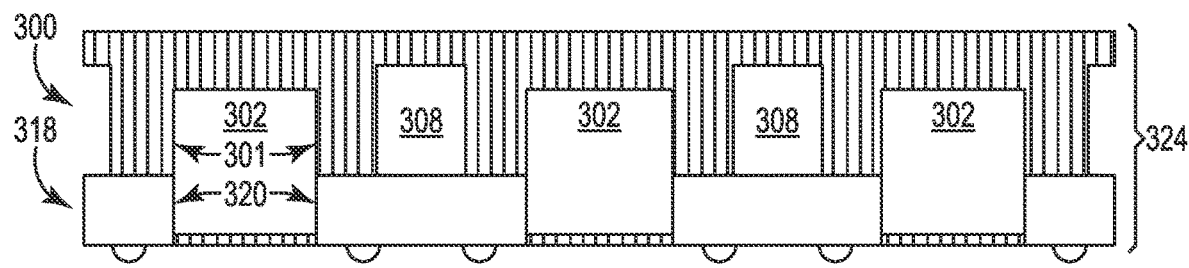

As illustrated in FIG. 13B, a packaged device 318 is provided that needs a lid. In one example, the packaged device 318 includes devices 322 that are microphones manufactured using eWLB technology. The packaged device 318 includes mold compounds 320. The devices 322 are positioned between the mold compounds 320. In one example, the devices 322 are microphones having thin membranes extending between the mold compounds 320. As illustrated in FIG. 13C, structured substrate 300 is bonded to packaged device 318 to form a batch lid assembly 324. In one example, the batch lid assembly is formed by bonding pillars 301 to corresponding mold compounds 320 using a suitable adhesive 321.

Figure 13D:
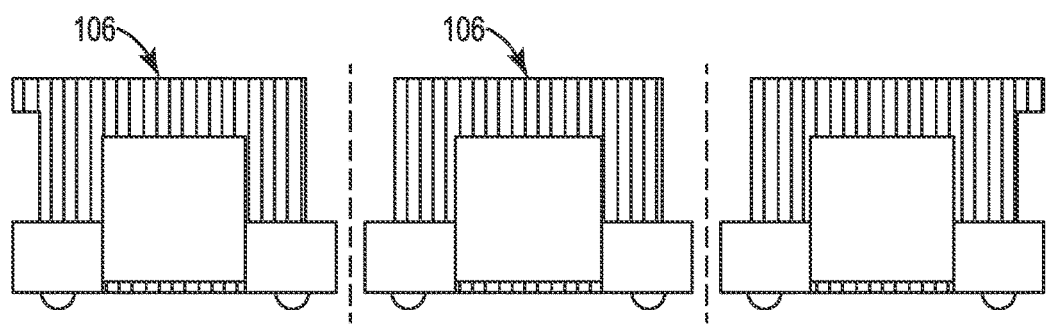

As illustrated in FIG. 13D, the semiconductor devices having lids made of a semiconductor material may now be separated. For example, the batch lid assembly may be separated into separate semiconductor devices by backside grinding the structured semiconductor substrate at the second cavities 306, and singulating the mold compounds 320, such as by dicing.

FIGS. 14A-14E illustrate another embodiment of mass production/batch processing of semiconductor devices, in particular a process is disclosed illustrating batch lid attachment to semiconductor devices. In this example, the lids are made of a mold material, and a structured silicon substrate is used as a negative to form the lids. In this example, the semiconductor devices having lids are singulated after the lids are attached to a semiconductor device.

Figure 14A:
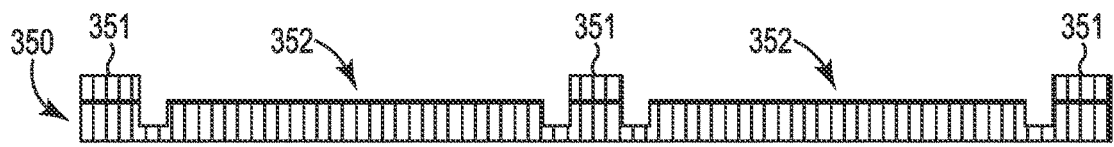
FIGS. 14A-14E illustrate one embodiment of a method for fabricating a semiconductor device including a lid.
Figure 14B:
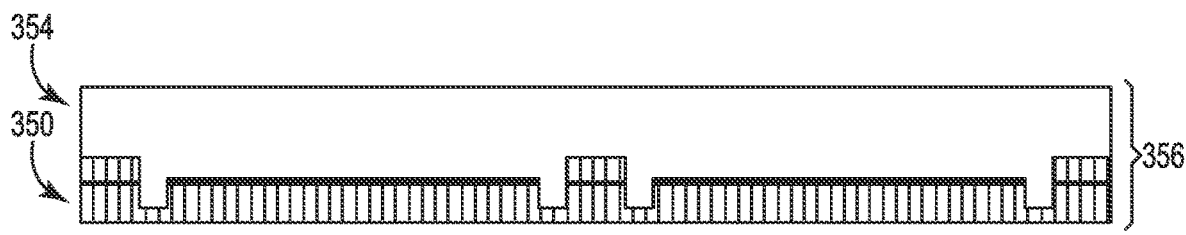
Figure 14C:
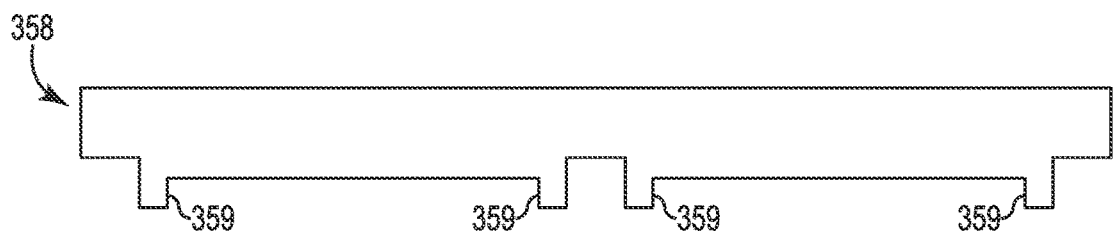

As illustrated in FIG. 14A, a structured silicon substrate 350 or wafer is formed. The structured substrate 350 is used as a negative to form batch lids out of a polymer material. The structured substrate 350 can be made with different etching depths using processes previously described herein. In one example, the substrate 350 includes pillars 351 defining cavities 352 having a structure that is the negative of the desired lid structures. As illustrated in FIG. 14B, the structured substrated is overmolded with a mold compound 354, such as a polymer material, to form an overmolded wafer stack 356. As illustrated in FIG. 14C, the silicon substrate 350 is removed using an etching process to form batch lid assembly 358 including pillars 359 that define each lid cavity.

Figure 14D:
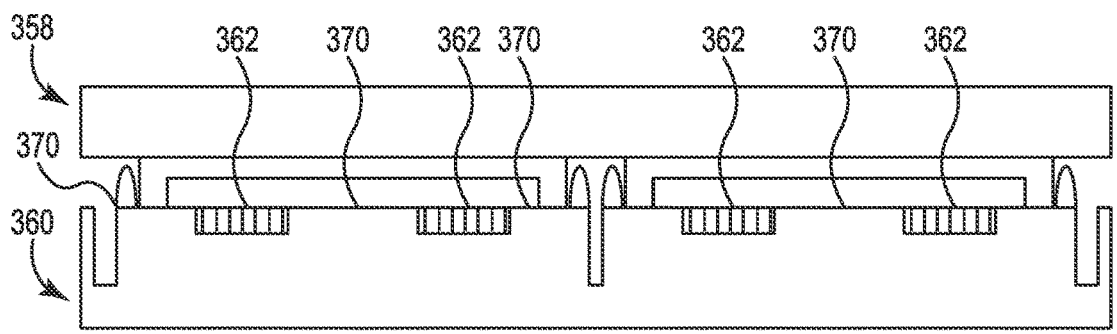

As illustrated in FIG. 14D, a packaged device 360 is provided that needs a lid. In one example, the packaged device 360 includes devices 362. Devices 362 are half diced SAW modules in the form of a wafer. In one example, the devices 362 are formed using eWLB technology. The packaged device 360 includes mold compounds 370. The devices 362 are positioned between the mold compounds 370. Batch lid structure 358 is bonded to packaged device 360 to form a batch lid assembly 374. In one example, the batch lid assembly 374 is formed by bonding pillars 359 to corresponding mold compounds 370 using a suitable adhesive.

Figure 14E:
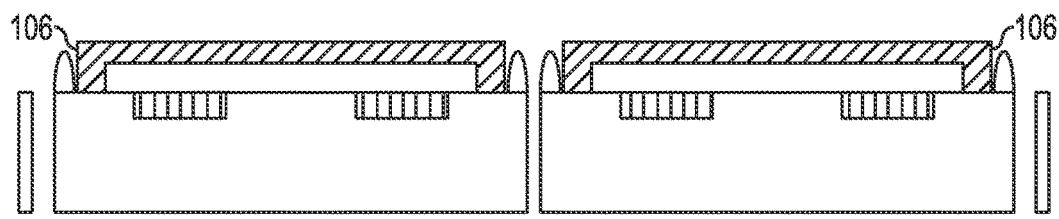

As illustrated in FIG. 14E, the semiconductor devices having lids made of a mold material may now be separated. For example, the batch lid assembly may be separated into separate semiconductor devices by grinding from the top and bottom side.

Embodiments of the disclosure provide semiconductor devices including lids. The lid or housing is positioned over a device to form a protective cavity about the device. In one example, the device is a sensor. In one example, the lid is made of a semiconductor material using a semiconductor process. A material layer may be positioned over the lid. In one example, the material layer is made of a mold compound. In another example, the lid is made of a polymer material. The lids may be formed as part of a batch process, and assembled as part of a batch lid assembly process.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor comprising:
   a substrate including a first major surface;
   a semiconductor device positioned on the first major surface of the substrate;
   a lid made of a semiconductor material and including an interior surface, an opposing exterior surface, and sidewalls extending from the interior surface in a direction away from the opposing exterior surface, the lid positioned on the first major surface of the substrate over the semiconductor device with the opposing exterior surface facing away from the first major surface such that the interior surface and sidewalls of the lid form a cavity about the semiconductor device, the interior surface forming a ceiling of the cavity and sidewalls of the lid forming sidewalls of the cavity, the lid including one or more active devices disposed on the interior surface and on the exterior surface of the lid, the lid including at least one active device on the ceiling of the cavity, wherein the cavity is between the at least one active device and the semiconductor device.

2. The semiconductor of claim 1, wherein the semiconductor device is a sensor device.

3. The semiconductor of claim 2, wherein the sensor is a microphone.

4. The semiconductor of claim 1, wherein the semiconductor device is a SAW filter.

5. The semiconductor of claim 1, wherein the lid is made of silicon.

6. The semiconductor of claim 5, wherein the silicon is a doped silicon.

7. The semiconductor of claim 1, wherein the lid includes an EMI shielding material that shields the electrical device from electromechanical interference.

8. The semiconductor of claim 7, wherein the EMI shielding material includes the lid being made from a doped silicon material.

9. The semiconductor of claim 8, wherein the doped silicon material is conductive.

10. The semiconductor of claim 7, comprising:
    the lid including a top surface; and
    a metallic layer at least partially positioned over the top surface.

11. The semiconductor of claim 7, comprising:
    the lid including an interior surface; and
    a metallic layer at least partially positioned over the interior surface.

12. The semiconductor of claim 1, comprising:
    a pattern formed in at least one of a first surface and a second surface of the lid.

13. The semiconductor of claim 12, wherein the pattern includes at least one of a bump or an indentation.

14. A method of making the semiconductor of claim 1 comprising:
    providing the substrate having the first major surface;
    positioning the semiconductor device on the first major surface of the substrate;
    making the lid from the semiconductor material using a semiconductor process, the lid including the interior surface, the opposing exterior surface, and sidewalls extending from the interior surface in the direction away from the opposing second surface; and
    positioning the lid on the semiconductor device such that the sidewalls and interior surface form the cavity about the semiconductor device with the interior surface of the lid forming the ceiling of the cavity and the sidewalls of the lid forming sidewalls of the cavity, the lid including the at least one active device on the ceiling of the cavity.

15. The method of claim 14, wherein the semiconductor device is a sensor device.

16. The method of claim 15, wherein the sensor is a microphone.

17. The method of claim 14, wherein the semiconductor device is a SAW filter.

18. The method of claim 14, including making the lid with a shielding material that shields that the electrical device from electromagnetic interference.

19. The method of claim 18, wherein the shielding material includes making the lid from a doped silicon material.

20. The method of claim 19, wherein the doped silicon material is conductive.

21. The method of claim 18, comprising:
   the lid including a top surface; and
   at least partially positioning a metal layer over the top surface.

22. The method of claim 18, comprising:
   the lid including an interior surface; and
   at least partially positioning a metal layer over the interior surface.

23. The method of claim 14, comprising:
   the lid including a first surface and a second surface; and
   forming a pattern in the first surface or the second surface.

24. The method of claim 23, wherein the pattern includes at least one of a bump or an indentation.

25. The method of claim 14, comprising: forming an encapsulation material over the lid and at least part of the substrate.

26. The semiconductor of claim 1, wherein the at least one active device comprises an integrated circuit.

27. A semiconductor package comprising:
   a substrate including a first major surface;
   multiple semiconductor devices positioned on and contacting the first major surface of the substrate;
   a lid made of a semiconductor material and including an interior surface, an opposing exterior surface, and sidewalls extending from the interior surface in a direction away from the opposing exterior surface, the lid positioned on the substrate such that the side walls and interior surface form a cavity about at least one of the semiconductor devices, the interior surface forming a ceiling of the cavity and the sidewalls of the lid forming sidewalls of the cavity, and at least one semiconductor device positioned external to the cavity, at least one active device positioned on the ceiling of the cavity.

* * * * *